(12) United States Patent
Marutani (10) Patent No.: US 10,325,886 B2
(45) Date of Patent: Jun. 18, 2019

(54) LIGHT EMITTING ELEMENT AND LIGHT EMITTING ELEMENT ARRAY

(71) Applicant: NICHIA CORPORATION, Anan-shi (JP)

(72) Inventor: Yukitoshi Marutani, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/705,263

(22) Filed: Sep. 15, 2017

(65) Prior Publication Data

US 2018/0019231 A1   Jan. 18, 2018

Related U.S. Application Data

(62) Division of application No. 14/541,199, filed on Nov. 14, 2014, now Pat. No. 9,825,011.

(30) Foreign Application Priority Data

Nov. 15, 2013   (JP) .................................. 2013-236922

(51) Int. Cl.
*H01L 25/075* (2006.01)
*H01L 33/20* (2010.01)

(52) U.S. Cl.
CPC .......... *H01L 25/0753* (2013.01); *H01L 33/20* (2013.01); *H01L 2924/0002* (2013.01)

(58) Field of Classification Search
None
See application file for complete search history.

(56) References Cited

U.S. PATENT DOCUMENTS

| 5,574,742 A | 11/1996 | Ben-Michael et al. |
| 5,665,985 A * | 9/1997 | Iwata .......................... B41J 2/45 257/465 |
| 2003/0053015 A1 | 3/2003 | Minoura et al. |
| 2006/0272572 A1 | 12/2006 | Uematsu et al. |
| 2009/0180294 A1 | 7/2009 | Baur et al. |

FOREIGN PATENT DOCUMENTS

| JP | 05-347429 | 12/1993 |
| JP | 07-202263 | 8/1995 |
| JP | 10-326910 | 12/1998 |
| JP | 2001-177146 | 6/2001 |
| JP | 2009-071174 | 4/2009 |
| JP | 2009-531839 | 9/2009 |

(Continued)

OTHER PUBLICATIONS

Brinkley et al., "Chip Shaping for Light Extraction Enhancement of Bulk c-Plane Light-Emitting Diodes", Applied Physics Express 5, 2012, pp. 032104-1-032104-3.

(Continued)

*Primary Examiner* — Fernando L Toledo
*Assistant Examiner* — Lawrence-Lin T Nguyen
(74) *Attorney, Agent, or Firm* — Mori & Ward, LLP (57) ABSTRACT

A light emitting element includes a semiconductor including an active layer, and a planar shape of the light emitting elements including a concave polygon. The planar shape of the concave polygon has interior angles including at least one acute angle.

28 Claims, 7 Drawing Sheets

(56) References Cited

FOREIGN PATENT DOCUMENTS

JP        2010-078813      4/2010
JP         2012-23249      2/2012

OTHER PUBLICATIONS

Office Action with Form PTO-892 Notice of References Cited issued by the U.S. Patent and Trademark Office for the parent U.S. Appl. No. 14/541,199, dated May 11, 2015.
Office Action with Form PTO-892 Notice of References Cited issued by the U.S. Patent and Trademark Office for the parent U.S. Appl. No. 14/541,199, dated Dec. 16, 2015.
Office Action with Form PTO-892 Notice of References Cited issued by the U.S. Patent and Trademark Office for the parent U.S. Appl. No. 14/541,199, dated Jan. 12, 2017.
Notice of Allowance with Form PTO-892 Notice of References Cited issued by the United States Patent and Trademark Office for the parent U.S. Appl. No. 14/541,199, dated Jun. 16, 2017.

* cited by examiner

LIGHT EMITTING ELEMENT AND LIGHT EMITTING ELEMENT ARRAY

CROSS-REFERENCE TO RELATED APPLICATIONS

The present application is a divisional application based on U.S. patent application Ser. No. 14/541,199 filed Nov. 14, 2014, and claims priority under 35 U. S. C. § 119 to Japanese Patent Application No. 2013-236922, filed Nov. 15, 2013. The contents of these applications are incorporated herein by reference in their entirety.

BACKGROUND OF THE INVENTION

Field of the Invention

The present invention relates to a light emitting element and a light emitting element array.

Discussion of the Background

Japanese Unexamined Patent Application Publication No. 10-326910 has proposed a triangular prism-shaped (FIG. 6 of this patent document) light emitting element and a truncated triangular pyramid-shaped (FIG. 10 of this patent document) light emitting element (see FIGS. 6 and 10 of this patent document). In this patent document, the following technique is described: that is, arranging outer surfaces of the light emitting element so as to form an acute angle therebetween reduces an angle, at which the light having undergone total internal reflection in the light emitting element is incident upon the next surface, and this can suppress repetition of total internal reflection in the light emitting element. The similar technique is described in claim 5 of Japanese Unexamined Patent Application Publication No. 2012-23249.

SUMMARY OF THE INVENTION

According to one aspect of the present invention, a light emitting element includes a semiconductor including an active layer and a planar shape of the light emitting element having a concave polygon. The planar shape of the concave polygon has interior angles including at least one acute angle.

According to another aspect of the present invention, a light emitting element array includes light emitting elements. Each of the light emitting elements include a semiconductor, and the semiconductor include an active layer, planar shapes of at least one of the light emitting elements include a concave polygon.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

An embodiment of the present invention is described below with reference to the drawings. It is to be understood that the embodiment described below is an example for embodying the technical concept of the present disclosure and does not limit the present invention. Also, for clarity of the description, the sizes, positional relationships, and so forth may be exaggerated in the drawings. In principle, the same designations or the same reference numerals denote the same or similar elements, and duplicate description is omitted where appropriate.

Light Emitting Element

Figure 1:
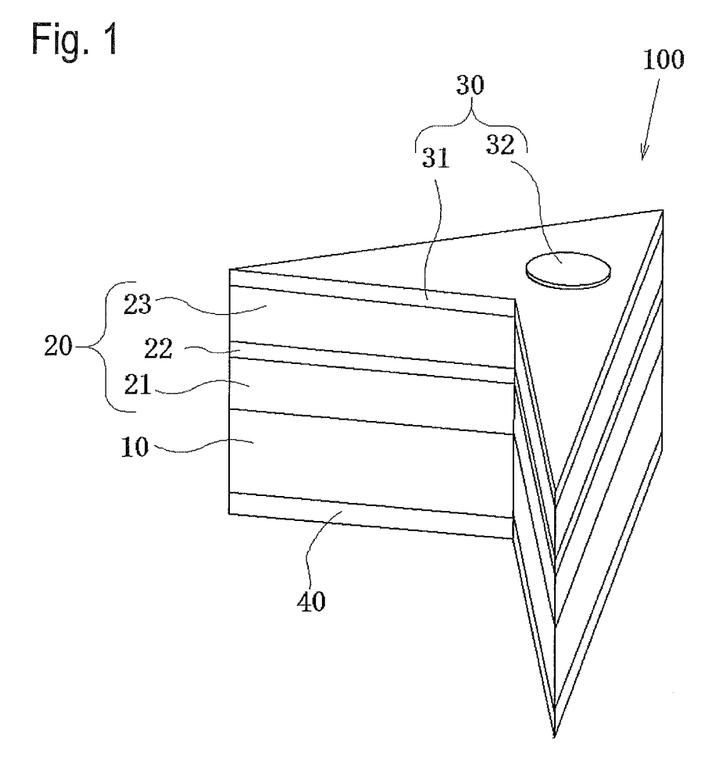
FIG. 1 is a perspective view of a light emitting element according to an embodiment.

FIG. 1 illustrates a schematic perspective view of a light emitting element 100 according to a first embodiment of the present invention. Herein, the lower side (a first electrode 40 side, that is, a mounting surface side) of the present light emitting element as viewed in FIG. 1 is referred to as the "lower" side, and the upper side (a second electrode 30 side, that is, a side opposite to the mounting surface side) as viewed in FIG. 1 is referred to as the "upper" side.

As illustrated in FIG. 1, in the first embodiment, the planar shape of the light emitting element 100 is a concave polygon (polygonal shape having a reentrant angle). Out of the interior angles of the concave polygon, one or more interior angles are reentrant angles (angle larger than 180° and smaller than 360°) and one or more interior angles are acute angles. Herein, the planar shape refers to the shape or the outline of the light emitting element 100 when the light emitting element 100 is seen from above and below. With the one or more interior angles of the planar shape being acute angles, repetition of total internal reflection of light generated in the light emitting element 100 is suppressed in the light emitting element 100, and accordingly, light extraction efficiency can be improved. Furthermore, in comparison with the case where no reentrant angle is formed in the planar shape, when a reentrant angle is provided in the planar shape, the length of the propagation of the light to a position where the light is extracted to the outside can be reduced. Thus, absorption of the light by electrodes or other members in the light emitting element 100 can be suppressed (the details will be described later). That is, with the light emitting element 100, which has both the above-described features, the light extraction efficiency can be significantly improved.

As illustrated in FIG. 1, the light emitting element 100 includes a semiconductor part 20 on a substrate 10. The semiconductor part 20 includes a first semiconductor layer 21, an active layer 22, and a second semiconductor layer 23.

A first electrode 40 can be provided on a lower surface of the substrate 10. The first electrode 40 can be light-reflective. A second electrode 30, which includes a transparent electrode 31 and a pad electrode 32, can be provided on an upper surface of the semiconductor part 20. The planar shape of the light emitting element 100 is a polygon having one or more acute interior angles and one or more reentrant angles.

Although the first electrode 40 is typically an n-electrode and the second electrode 30 is typically a p-electrode in the present embodiment, the first electrode 40 may be a p-electrode and the second electrode 30 may be an n-electrode.

FIG. 1 is drawn such that the external shape of the semiconductor part 20 matches those of the first electrode 40 and the transparent electrode 31. However, the external shapes of the first electrode 40 and the transparent electrode 31 may be actually smaller than that of the semiconductor part 20. Furthermore, regions near side surfaces where the active layer 22 is exposed may be coated with an insulating layer for preventing short circuit. Also, the tip of acute angle portions may be rounded for preventing chipping.

Figure 2A:
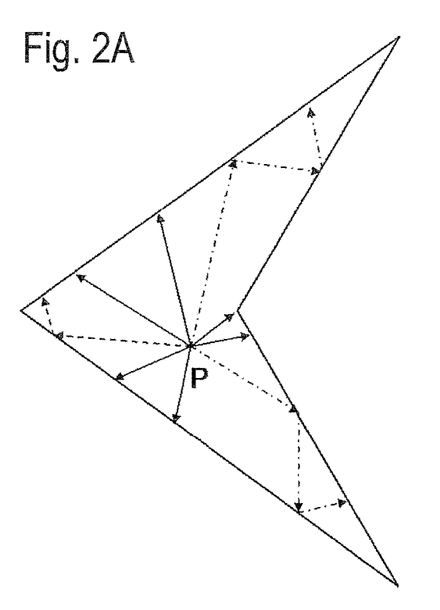
FIGS. 2A and 2B illustrate that, in the light emitting element according to the embodiment, the distance from where light is generated in the light emitting element to where the light is extracted to the outside of the light emitting element is reduced.
Figure 2B:
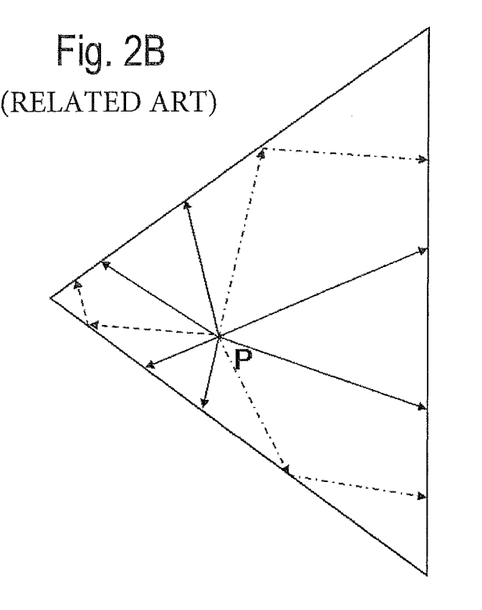

Referring to FIGS. 2A and 2B, in comparison with the related-art example, the effects of the light emitting element 100 is described. FIGS. 2A and 2B illustrate the length of the paths in plan view of the light generated in a point P in the light emitting element to the position where the light is extracted to the outside. FIG. 2A illustrates the light emitting element 100, which has a concave quadrangle planar shape. FIG. 2B illustrates the related-art example of the light emitting element having a convex triangular planar shape. When one of the interior angles is a reentrant angle as illustrated in FIG. 2A, the distances from the point P in the light emitting element to the sides of the polygon that form the reentrant angle, that is, the side surfaces of the light emitting element, can be reduced compared to the convex triangle as illustrated in FIG. 2B. By reducing the distances from a position where the light is generated to the side surfaces where the light is extracted, absorption of the light generated in the active layer 22 by the electrodes or the like in the light emitting element can be reduced. As a result, the light emitting element 100 with high light extraction efficiency can be realized.

Preferably, the planar shape of the light emitting element 100 is, among concave polygons, a concave quadrangle including three acute interior angles and one reentrant angle as illustrated in FIG. 1. When the planar shape of the light emitting element 100 is a concave quadrangle, all interior angles except for the reentrant angle can be acute angles. When the interior angles except for the reentrant angle are acute angles, incident angles, at which the light generated in the light emitting element 100 is incident upon the side surfaces, can be reduced in two surfaces forming an acute angle therebetween. Thus, the ratio of the light subjected to the total internal reflection in the light emitting element 100 to the light incident upon the side surfaces can be reduced, and the ratio of the light extracted to the outside to the light incident upon the side surfaces can be increased. That is, light extraction efficiency of the light emitting element 100 can be improved. Furthermore, since the concave quadrangle is a simpler shape compared to a concave pentagon or a concave hexagon, when the light emitting element 100 is cut out from the substrate 10 with the layers stacked on it (referred to as a wafer hereafter) in a manufacturing process, breakage or chipping can be suppressed compared to the case where the light emitting element has a concave polygon other than the concave quadrangle. Thus, the yield in the manufacturing process can be improved.

Figure 3:
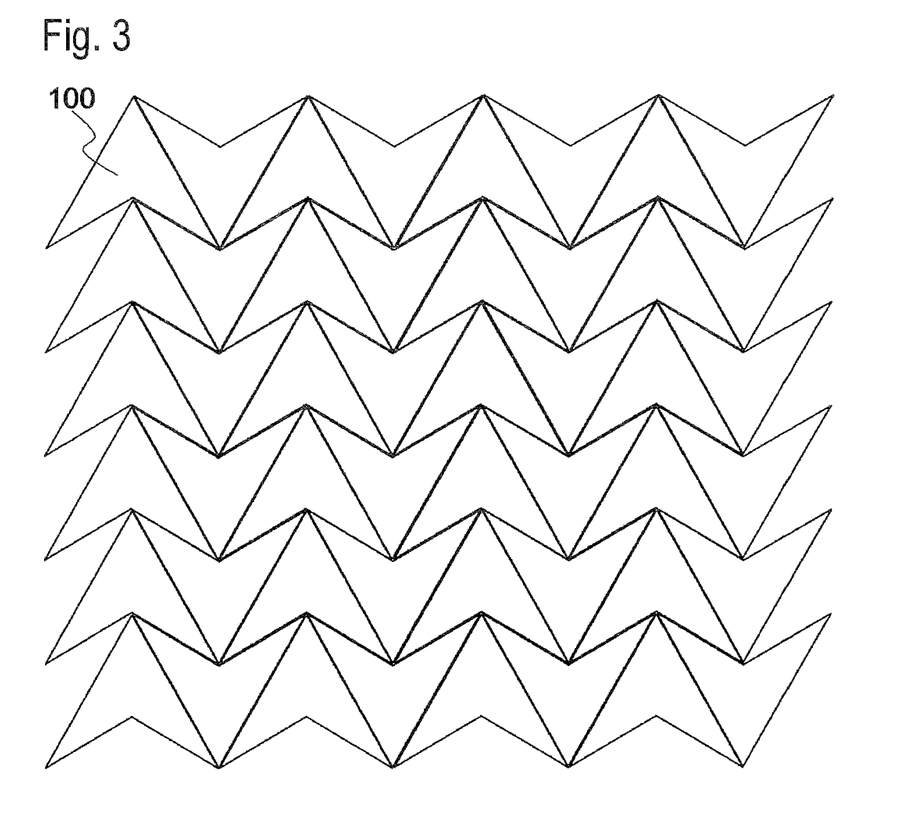
FIG. 3 explains that a tessellation can be formed by the single planar shape of the light emitting element according to the embodiment.
Figure 4A:
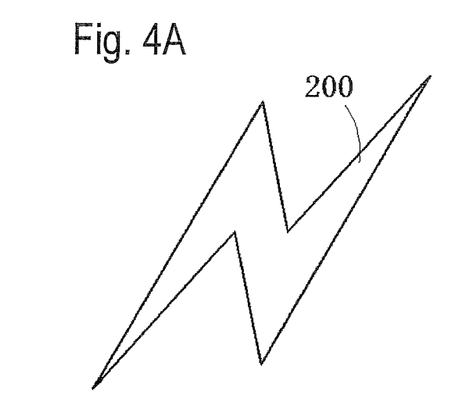
FIGS. 4A to 4C illustrate planar shapes of the light emitting elements other than that illustrated in FIG. 1 according to other embodiments.
Figure 4B:
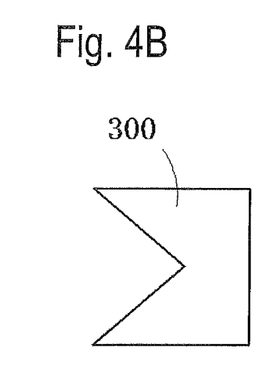
Figure 4C:
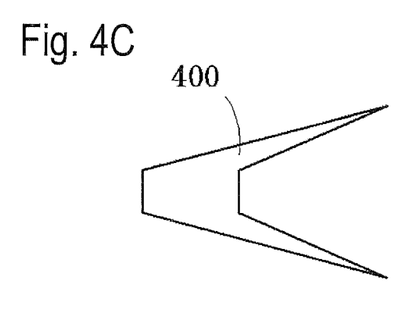

Preferably, the planar shape of the light emitting element 100 is a shape capable of forming a so-called tessellation, that is, the planar shape of the light emitting element 100 allows a planar configuration of multiple repetitions of the planar shape closely fit together, that is, substantially without leaving a gap or without overlapping. FIG. 3 illustrates an example in which a tessellation is formed by the single planar shape of the light emitting element 100. By forming the light emitting element 100 to have a planar shape capable of forming a tessellation, a wafer can be separated into a plurality of light emitting elements 100 reducing useless portions of the wafer when the light emitting element 100 is cut out from a wafer. Examples of a concave polygon capable of forming a tessellation other than the concave quadrangle include the following shapes: a hexagon having parallel opposite sides and having two reentrant angles (FIG. 4A, light emitting element 200); a shape obtained by dividing a hexagon having parallel opposite sides and two reentrant angles into two congruent concave polygons (FIG. 4B, light emitting element 300); and a shape formed by cutting part of a concave hexagon having parallel opposite sides and connecting a cut part of the concave hexagon to a remaining part of the concave hexagon such that a side of the cut part corresponds to another side of the remaining part which was parallel to the side of the cut part before being cut (FIG. 4C, light emitting element 400).

The materials and the film thicknesses of the components are not particularly limited. Known materials can be appropriately used. In the present embodiment, in order to form the semiconductor part 20 on the substrate 10, the substrate 10 is formed of a material suitable for epitaxial growth of the semiconductor part 20. Referring back to FIG. 1, the first electrode 40 is formed on a surface of the substrate 10 where the semiconductor part 20 is not formed, and the second electrode 30 is formed on the semiconductor part 20. In such a case, the substrate 10 interposed between both the electrodes is required to be electrically conductive. Thus, examples of the material of the substrate 10 include, for example, a nitride semiconductor (such as GaN), GaAs, GaP, Si, and SiC. For example, an about 300 μm thick n-type GaN substrate having the (0001) plane as a main surface can be used as the substrate 10.

More specifically, for example, a group III nitride compound semiconductor layer having a multilayer structure can be formed on the GaN substrate 10 as the semiconductor part 20. In the semiconductor part 20, for example, a 4.6 μm thick Si-doped n-type GaN layer can be used as the first semiconductor layer 21, a multiple quantum well structure (six wells) having well layers (3 nm thick, $In_{0.3}Ga_{0.7}N$) and barrier layers (25 nm thick GaN) can be used as the active layer 22, and a 20 nm thick Mg-doped p-type $Al_{0.2}Ga_{0.8}N$ 0.2 μm thick Mg-doped p-type GaN layer can be used as the second semiconductor layer 23. As the first electrode 40, for example, Ti/Al/Ni/Au, Ti/Al, or Ti/Al/Ti/Pt/Al can be used. As the transparent electrode 31 of the second electrode 30, for example, 60 nm thick indium tin oxide (ITO) can be used. As the pad electrode 32 of the second electrode 30, for example, Pt/Au or Ti/Rh/Au can be used.

Various forms other than the form as illustrated in FIG. 1 are possible. Examples of the other forms can include, for example, the following forms: a flip-chip light emitting element that includes the substrate 10, which uses an insulating light-transmissive substrate formed of, for example, sapphire, and the first electrode 40 and the second electrode 30 formed on the surface of the semiconductor part 20 which is a different side from the side of the surface of the substrate 10; or a structure that include an electrically conductive adhesive layer, the second electrode 30, the semiconductor part 20, and the first electrode 40 on an electrically conductive non light-transmissive support substrate formed of, for example, CuW. Although the second electrode 30 includes the transparent electrode 31 so as to allow the light to be simultaneously extracted from the upper surface and the side surfaces of the light emitting element 100 in the present embodiment, for example, the following alternative structure may be used. That is, the first electrode 40 and the second electrode 30 are made to be optically reflective so as to allow the light to be extracted only from the side surfaces of the light emitting element 100.

Light Emitting Element Array

Figure 5A:
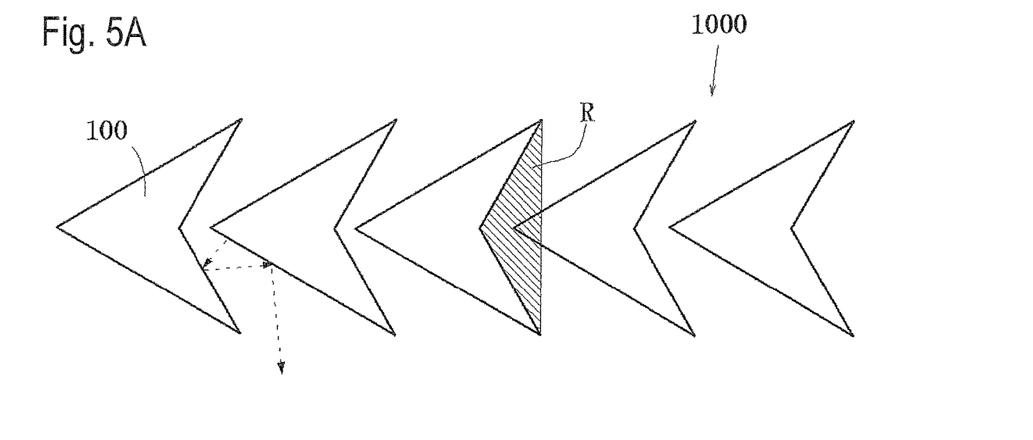
FIGS. 5A to 5C illustrate comparison of a light emitting element array using the light emitting elements according to the embodiments and a related-art example of a light emitting element array.
Figure 5B:
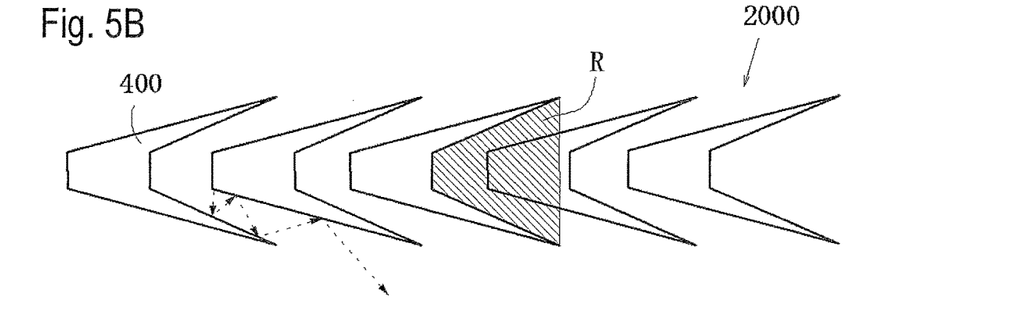
Figure 5C:
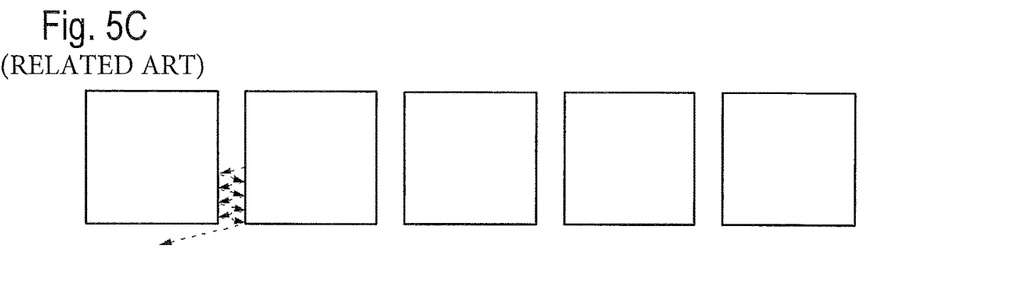

A light emitting element array can be obtained by arranging a plurality of the light emitting elements as described above and mounting the light emitting element array on a board. FIGS. 5A to 5C illustrate examples of the light emitting element array. FIG. 5A illustrates a light emitting element array 1000. In the light emitting element array 1000, an orientation of the reentrant angles of the light emitting elements 100 matches an arrangement direction of the light emitting elements 100. Herein, the "orientation of the reentrant angles" refers to an orientation along a line perpendicular to a line connecting the vertices of the salient angles adjacent to the reentrant angle (diagonal line that lies outside the concave polygon). The light emitting elements 100 are preferably arranged as follows: that is, as illustrated in FIG. 5A, a portion of another light emitting element is disposed in a region (region R) surrounded by the sides that form the reentrant angle of the concave polygon in the planar shape of the light emitting elements 100 and a line connecting the vertices of salient angles adjacent to the reentrant angle (diagonal line that lies outside the concave polygon). Here, the "salient angle adjacent to the reentrant angle" refers to an angle that one of the sides forming the reentrant angle makes with one of other sides of the concave polygon, at an end portion not having the reentrant angle. In other words, in the light emitting element array 1000, part of the other light emitting element is preferably disposed in a polygonal region, which is a region defined by subtracting a region inside the concave polygon from a region surrounded by lines connecting the vertices of all the salient angles of the planar shape of the light emitting element 100 other than the reentrant angle. Thus, when the light emitting element array is seen from the side surface side of the light emitting elements 100, it appears that there is no gap between the light emitting elements. This allows variation in brightness to be suppressed in a side surface direction when the light emitting element array emits light.

FIG. 5B illustrates a case of a light emitting element array 2000 formed by arranging the light emitting elements 400 as illustrated in FIG. 4C. In the planar shape of the light emitting element 400, two adjacent interior angles from among a plurality of interior angles are reentrant angles. Also in this case, part of another light emitting element is preferably disposed in the region R similar to that in FIG. 5A (part of the other light emitting element is disposed in a polygonal region, which is a region defined by subtracting a region inside the concave polygon from a region surrounded by lines connecting the vertices of all the salient angles other than the reentrant angles). Thus, the effects, which is similar to those produced by the light emitting element array 1000 illustrated in FIG. 5A, can be produced. The light emitting element array can be formed of the light emitting elements of a plurality of types of planar shapes. For example, a light emitting element array can be formed by arranging the light emitting elements 100 having the planar shape as illustrated in FIG. 1 and the light emitting elements 400 having the planar shape in which a plurality of reentrant angles are adjacent to each other as illustrated in FIG. 4C.

FIG. 5C is a related-art example of an array for comparison, in which related-art light emitting elements having a rectangular parallelepiped shape are arranged. In this case, light generated in the light emitting elements and extracted from side surfaces of the light emitting elements attenuates due to absorption by the adjacent light emitting elements while repeatedly reflecting between the side surfaces of the adjacent light emitting elements. In the cases of FIGS. 5A and 5B, the distance between each of the two sides that form the reentrant angle or reentrant angles of the light emitting element and a corresponding one of the adjacent two sides that form salient angles of the light emitting element increases as the distance from the reentrant angles increases. Thus, as indicated by arrows in FIGS. 5A and 5B, compared to the case where the distance between the light emitting elements are uniform (FIG. 5C), the number of times, by which the light extracted from the side surfaces of the light emitting elements is reflected between the side surfaces and the adjacent light emitting elements, can be reduced.

Figure 6A:
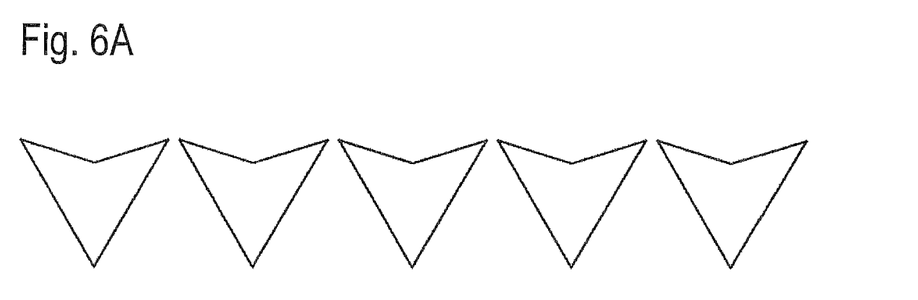
FIGS. 6A and 6B illustrate examples of arrangements of the light emitting elements in the light emitting element arrays other than those illustrated FIGS. 5A to 5C, using the light emitting elements according to the embodiments.
Figure 6B:
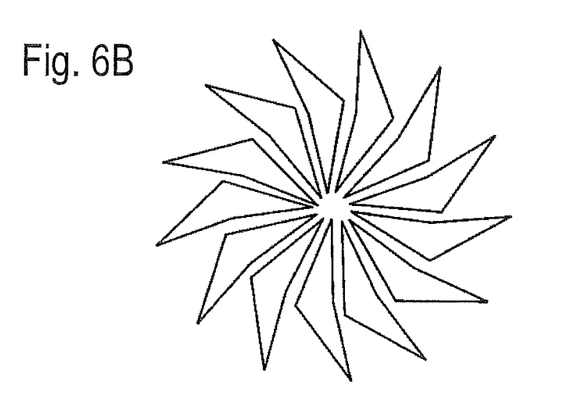

As an alternative form of the light emitting element array, as illustrated in FIG. 6A, the light emitting elements 100 can be arranged such that the orientation of the reentrant angles of the light emitting elements 100 is substantially perpendicular to the arrangement direction. In this case, by changing the reentrant angles, the amount of light that exits the reentrant angle side can be adjusted. Thus, distribution of light of the light emitting element can be asymmetric. This light emitting element can be preferably used for indirect lighting such as cove lighting. Furthermore, the light emitting elements 100 can be annularly arranged as illustrated in FIG. 6B. The light emitting elements in such arrangement can be preferably used as a light source of a spotlight.

Method of Manufacturing Light Emitting Element

An example of a method of manufacturing the light emitting element 100 according to the present embodiment will be specifically described below.

Semiconductor Part Growth Step

The semiconductor part 20 including the first semiconductor layer 21, the active layer 22, and the second semiconductor layer 23 is epitaxially grown on the substrate 10 (on the (0001) surface) by, for example, a metal-organic chemical vapor deposition (MOCVD) method. An orientation flat, which indicates the crystal orientation, is provided at an end of the substrate 10 such that a (10-10) surface of the GaN single crystal is exposed. In a crystal growth by the MOCVD method, hydrogen ($H_2$) or nitrogen ($N_2$) is used as a carrier gas. As group III materials, trimethyl gallium (TMG) or triethyl gallium (TEG) are used as a Ga source, trimethyl aluminum (TMA) is used as an Al source, and trimethyl indium (TMI) is used as an In source. As a group V material, ammonia ($NH_3$) is used as an N source. As the dopant, monosilane ($SiH_4$) is used as a Si material for the n-type, and bis-cyclopentadienyl magnesium ($Cp_2Mg$) is used as an Mg material for the p-type. By changing the supply amount of these material gases, the composition of each of the group III nitride compound semiconductor layers can be adjusted. The crystal growth can be performed under a pressure of, for example, around one atmosphere (around 100 kPa).

Step of Forming Second Electrode

Figure 7:
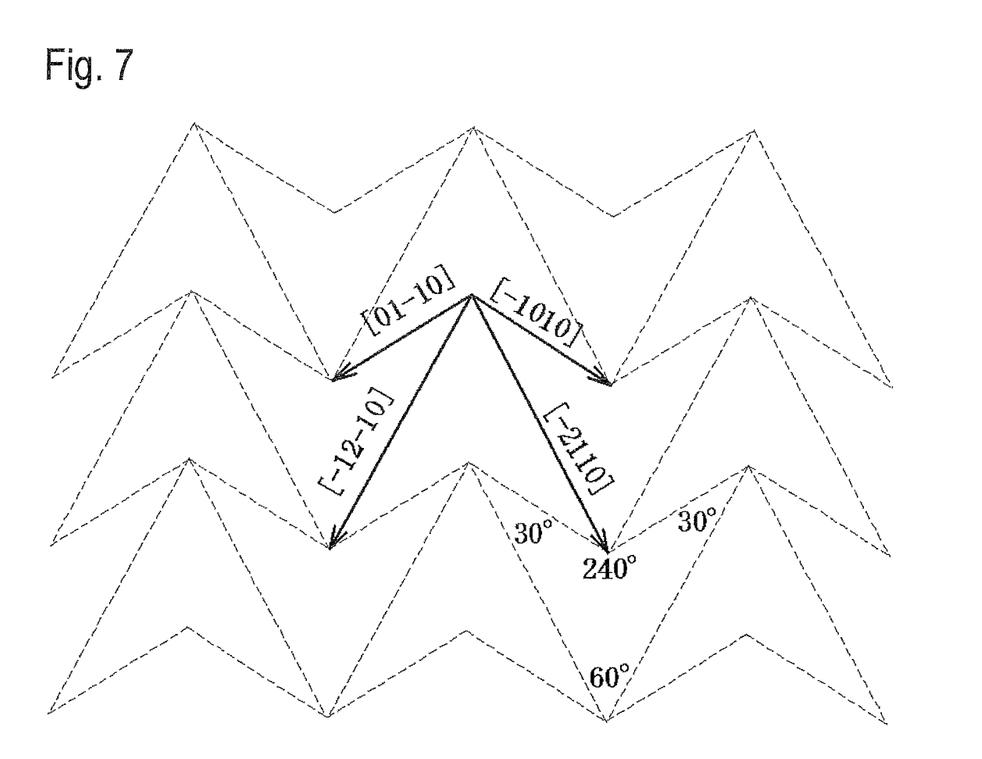
FIG. 7 illustrates a method of cutting out the light emitting element in a method of manufacturing the light emitting element according to the embodiment.

The second electrode 30 is formed on the second semiconductor layer 23 by a known semiconductor wafer process techniques such as photolithography, reactive ion etching, chemical vapor deposition (CVD), sputtering, vapor deposition, lift-off, and annealing. Initially, the transparent electrode 31 is formed at a predetermined position on the second semiconductor layer 23 by typical photolithography, sputtering, and lift-off. Next, a groove having a width of about 50 μm is formed as an outer periphery of a substantially concave polygon by photolithography and reactive ion etching so that the first semiconductor layer 21 is exposed from the bottom of the groove. The concave polygon is, for example, the following concave quadrangle corresponding to that in FIG. 1: that is, as illustrated in FIG. 7, the interior angles are respectively 240°, 30°, 60°, and 30°, and the lengths of the sides are respectively about 1 mm, 0.58 mm, 0.58 mm, and 1 mm). By forming the light emitting element 100 to have the concave quadrangular planar shape and setting the long side of the concave quadrangle parallel to the orientation flat of the substrate, the side surfaces of the light emitting element 100 can be a {10-10} surface and a {11-20} surface. This allows the chip to be easily separated. Next, a resist having been used as a mask in the reactive etching is removed. After that, an insulating film of $SiO_2$ or the like is entirely formed on the resultant structure by plasma CVD method. Next, a contact hole is formed at part of the insulating film on the transparent electrode 31 by photolithography and reactive ion etching, and the pad electrode 32 is formed to have a specified shape so that the pad electrode 32 covers the contact hole.

Wafer Polishing Step

Next, the wafer, in which the second electrode 30 has been formed, is polished to adjust the thickness of the wafer. The wafer is bonded to a polishing holder, the lower surface of the wafer ((000-1) surface), which becomes a polished surface of the wafer, is ground by a grinder, and then the wafer is polished by a lapping machine with a polishing agent. The wafer polishing step is finished with a chemical mechanical polishing (CMP) performed on a polishing cloth with an alkaline aqueous solution. By performing the polishing step of multiple stages, the total thickness of the wafer becomes around 100 μm, and the lower surface of the wafer becomes a flat mirror surface.

Step of Forming First Electrode

The polished wafer is removed from the holder and then subjected to a process by a semiconductor wafer process apparatus. The first electrode 40 is formed at a predetermined position on the lower surface ((000-1) surface) of the substrate 10 of the polished wafer by typical photolithography, sputtering, and lift-off. Simultaneously, a region (scribe street) of about 50 μm wide, in which the first electrode 40 is not provided, is formed on the lower surface of the substrate 10 so as to oppose the groove at the outer periphery of the substantially concave quadrangle.

Singulation Step

Next, an adhesive sheet (dicing tape) is bonded to a metal ring (dicing frame, dicing ring, ring frame, ring) to hold (wafer mount) the wafer in which the first electrode 40 has been formed. The light emitting element 100 is cut out along the outline of the chip by laser processing. More specifically, the laser processing is performed by, for example, stealth dicing utilizing multiphoton absorption, laser ablation, deep grooving utilizing laser-induced backside wet etching (LIBWE) method, or a laser water jet. Then, the laser light is condensed by an objective lens optical system, part of the wafer along the scribe street is irradiated with the laser light focusing on the inside of the GaN substrate, multiphoton absorption is caused in the focus region, broken lines are drawn in four directions (for example, [−1010], [−2110], [−12-10], [01-10] or the like) by stealth dicing, in which a reformed region having a lower crystal strength than that before the irradiation is formed inside the GaN substrate. Then, the laser light is focused on a deep position from the lower surface of the substrate and scanning is performed, and then, the laser light is focused on a shallower position from the lower surface and a second operation is performed so as to cut out a chip having a substantially concave quadrangular outline (see FIG. 7). At this time, when cleavage surfaces of the substrate are perpendicular to the active layer, the cleavage surfaces of the substrate 10 can be used as the side surfaces of the light emitting element 100. When cleavage surfaces of the substrate diagonally intersect the active layer 22, wafer singulation is performed in such directions that the cleavage surfaces are unlikely to be exposed. After that, the light emitting element 100 is separated by expanding.

With the method as described above, the light emitting element 100 of high lighting efficiency can be manufactured.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting element comprising:
    a semiconductor including an active layer and having a shape of a concave polygon when viewed in a height direction along a height of the light emitting element, the concave polygon having:
        a first side having a first end and a second end opposite to the first end;
        a second side substantially parallel to the first side, the second side having a third end and a fourth end opposite to the third end;
        a third side connecting the first end and the third end;
        a fourth side extended from the second end and having a fifth end opposite to the second end; and
        a fifth side connecting the fourth end and the fifth end such that an interior angle made by the fourth side and the fifth side is a reentrant angle; and
    a substrate provided on the semiconductor in the height direction and having an outermost external contour when viewed in the height direction, the outermost external contour having a concave polygon substantially same as the concave polygon of the semiconductor.

2. The light emitting element according to claim 1, wherein the substrate is a light-transmissive substrate that is transmissive of light emitted from the active layer.

3. The light emitting element according to claim 1, wherein an entirety of the light emitting element has a shape of the concave polygon when viewed in the height direction.

4. The light emitting element according to claim 1, wherein the concave polygon allows a planar configuration of multiple repetitions of the concave polygon fitted together.

5. The light emitting element according to claim 1, further comprising a first electrode and a second electrode, wherein the first electrode and the second electrode each have an outermost external contour that is within the concave polygon when viewed in the height direction.

6. The light emitting element according to claim 1, further comprising a transparent upper electrode so as to allow light emitted from the active layer to be extracted from an upper surface of the light emitting element.

7. The light emitting element according to claim 1, wherein the concave polygon is formed only of straight lines.

8. The light emitting element according to claim 1, wherein the concave polygon is an outermost outline of the light emitting element, and
wherein interior angles of the concave polygon are defined by the outermost outline.

9. The light emitting element according to claim 5, wherein the outermost external contour of each of the first electrode and the second electrode has a concave polygon substantially same as the concave polygon of the semiconductor when viewed in the height direction.

10. A light emitting element comprising:
a semiconductor including an active layer and having a shape of a concave polygon when viewed in a height direction along a height of the light emitting element, the concave polygon having:
   a first side having a first end and a second end opposite to the first end;
   a second side substantially parallel to the first side, the second side having a third end and a fourth end opposite to the third end;
   a third side extended from the first end and having a fifth end opposite to the first end such that a first interior angle made by the first side and the third side is a reentrant angle;
   a fourth side connecting the third end and the fifth end;
   a fifth side extended from the second end and having a sixth end opposite to the second end such that a second interior angle made by the first side and the fifth side is a reentrant angle; and
   a sixth side connecting the fourth end and the sixth end; and
a substrate provided on the semiconductor in the height direction and having an outermost external contour when viewed in the height direction, the outermost external contour having a concave polygon substantially the same as the concave polygon of the semiconductor.

11. The light emitting element according to claim 10, wherein the substrate is a light-transmissive substrate that is transmissive of light emitted from the active layer.

12. The light emitting element according to claim 10, wherein an entirety of the light emitting element has a shape of the concave polygon when viewed in the height direction.

13. The light emitting element according to claim 10, wherein the concave polygon allows a planar configuration of multiple repetitions of the concave polygon fitted together.

14. The light emitting element according to claim 10, further comprising a first electrode and a second electrode, wherein the first electrode and the second electrode each have an outermost external contour that is within the concave polygon when viewed in the height direction.

15. The light emitting element according to claim 10, further comprising a transparent upper electrode so as to allow light emitted from the active layer to be extracted from an upper surface of the light emitting element.

16. The light emitting element according to claim 10, wherein the concave polygon is formed only of straight lines.

17. The light emitting element according to claim 10, wherein the concave polygon is an outermost outline of the light emitting element, and
wherein interior angles of the concave polygon are defined by the outermost outline.

18. The light emitting element according to claim 14, wherein the outermost external contour of each of the first electrode and the second electrode has a concave polygon substantially same as the concave polygon of the semiconductor when viewed in the height direction.

19. A light emitting element array comprising:
light emitting elements provided on a plane, each of the light emitting elements comprising:
   a semiconductor including an active layer and having a shape of a concave polygon when viewed in a height direction along a height of the light emitting element, the concave polygon having:
      a first side having a first end and a second end opposite to the first end;
      a second side substantially parallel to the first side, the second side having a third end and a fourth end opposite to the third end;
      a third side extended from the first end and having a fifth end opposite to the first end such that a first interior angle made by the first side and the third side is a reentrant angle;
      a fourth side connecting the third end and the fifth end;
      a fifth side extended from the second end and having a sixth end opposite to the second end such that a second interior angle made by the first side and the fifth side is a reentrant angle; and
      a sixth side connecting the fourth end and the sixth end; and
   a substrate provided on the semiconductor in the height direction and having an outermost external contour when viewed in the height direction, the outermost external contour having a concave polygon substantially same as the concave polygon of the semiconductor.

20. The light emitting element array according to claim 19, wherein the substrate is a light-transmissive substrate that is transmissive of light emitted from the active layer.

21. The light emitting element array according to claim 19, wherein an entirety of each of the light emitting elements has a shape of the concave polygon when viewed in the height direction.

22. The light emitting element array according to claim 19, wherein at least one of the light emitting elements adjacent to another one of the light emitting elements is provided in a region surrounded by:
   a line connecting the fifth end of the another one of the light emitting element and the sixth end of the another one of the light emitting element;
   the first side of the another one of the light emitting element;
   the third side of the another one of the light emitting element; and
   the fifth side of the another one of the light emitting element.

23. The light emitting element array according to claim 19, wherein the light emitting elements are annularly arranged.

24. The light emitting element array according to claim 19, wherein the at least one of the light emitting elements further comprises a first electrode and a second electrode, and wherein the first electrode and the second electrode each have an outermost external contour that is within the concave polygon when viewed in the height direction.

25. The light emitting element array according to claim 19, wherein the at least one of the light emitting elements further comprises a transparent upper electrode so as to allow light emitted from the active layer to be extracted from an upper surface of the at least one of the light emitting elements.

26. The light emitting element array according to claim 19, wherein the concave polygon is formed only of straight lines.

27. The light emitting element array according to claim 19, wherein the concave polygon is an outermost outline of the light emitting element, and wherein interior angles of the concave polygon are defined by the outermost outline.

28. The light emitting element according to claim 24, wherein the outermost external contour of each of the first electrode and the second electrode has a concave polygon substantially same as the concave polygon of the semiconductor when viewed in the height direction.

* * * * *